United States Patent
Kraemer et al.

(10) Patent No.: US 7,821,345 B2
(45) Date of Patent: Oct. 26, 2010

(54) CALIBRATING AN OSCILLATOR AND CORRESPONDING CALIBRATION DEVICE

(75) Inventors: Michael Kraemer, Brii et Angonnes (FR); Sebastien Rieubon, Moirans (FR)

(73) Assignee: STMicroelectronics SA, Montrouge (FR)

( * ) Notice: Subject to any disclaimer, the term of this patent is extended or adjusted under 35 U.S.C. 154(b) by 128 days.

(21) Appl. No.: 11/656,900

(22) Filed: Jan. 23, 2007

(65) Prior Publication Data

US 2007/0188245 A1    Aug. 16, 2007

(30) Foreign Application Priority Data

Jan. 24, 2006   (FR) .................................. 06 00638

(51) Int. Cl.
*H03L 7/00* (2006.01)
(52) U.S. Cl. .............................. 331/44; 331/11; 331/16
(58) Field of Classification Search .................. 331/11, 331/16, 44
See application file for complete search history.

(56) References Cited

U.S. PATENT DOCUMENTS

| | | | |
|---|---|---|---|
| 6,670,852 B1 * | 12/2003 | Hauck | 327/156 |
| 7,099,643 B2 * | 8/2006 | Lin | 455/255 |
| 7,323,942 B2 * | 1/2008 | Ishizaka et al. | 331/10 |
| 2003/0197564 A1 | 10/2003 | Humphreys et al. | |
| 2005/0083137 A1 | 4/2005 | Lee et al. | |
| 2005/0137816 A1 | 6/2005 | Chuang et al. | |
| 2005/0258906 A1 | 11/2005 | Su et al. | |

* cited by examiner

*Primary Examiner*—Robert Pascal
*Assistant Examiner*—James E Goodley

(57) ABSTRACT

A method of calibrating an oscillator in order to compensate the dispersions generated, on the one hand, during the process of fabricating the oscillator circuit components and, on the other hand, by variations of operating conditions by modifying the parameters of a resonant component, for example a capacitor or an induction coil of the oscillator, in order to change the frequency range covered by the oscillator, according to the control voltage. Accordingly, calibrating the oscillator adjusts the output frequency of the oscillator according to an oscillator control signal. The calibration device determines the difference between the output frequency of the oscillator divided by a quantity and a reference frequency of the oscillator. The device includes a set of impedances selectively connected to the oscillator and each corresponding to a frequency deviation of the oscillator, and a calibration stage to generate a calibration word according to the measured frequency difference.

20 Claims, 2 Drawing Sheets

CALIBRATING AN OSCILLATOR AND CORRESPONDING CALIBRATION DEVICE

CROSS-REFERENCE TO RELATED APPLICATIONS

The present application is related to French Patent Application No. 0600638, filed Jan. 24, 2006, entitled "METHOD OF CALIBRATING AN OSCILLATOR AND CORRESPONDING CALIBRATION DEVICE". French Patent Application No. 0600638 is assigned to the assignee of the present application and is hereby incorporated by reference into the present disclosure as if fully set forth herein. The present application hereby claims priority under 35 U.S.C. §119(a) to French Patent Application No. 0600638.

TECHNICAL FIELD

The present disclosure relates to oscillators and in particular to the calibration of a voltage-controlled oscillator (VCO).

BACKGROUND

Synthesizing a frequency by means of a VCO type oscillator is widely known. For this application, the VCO oscillator is associated with a phase-locked loop PLL. In such a circuit, a VCO oscillator control voltage is generated so as to make the output frequency of the oscillator match a reference frequency. The duly generated frequency is determined according to the type of use: mobile telephony (GSM, DCS, PSC, and other standards), VHF, UHF, and other similar communications.

Although the frequency synthesis circuit fabrication methods are increasingly fine and accurate, the output frequency of the oscillator is likely to vary according to a certain number of parameters linked, on the one hand, to the fabrication method and, on the other hand, to the conditions in which the oscillator is intended to operate. Such is, in particular, the case of a change of temperature which is likely to generate a variation in the value of the components of the oscillator, for example, the value of a capacitor in the oscillator circuit, but also to act on the value of the spurious components.

These changes are likely to induce a change in the output frequency of the oscillator, which is then likely to diverge from a required frequency.

When the frequency deviation is small, the phase-locked loop PLL acts on the oscillator control voltage so as to compensate the frequency deviation. However, when the difference between the output frequency of the oscillator and the reference frequency is so great that the PLL can no longer compensate it, the oscillator is no longer able to supply the desired frequency and malfunctions are likely to occur in the circuits in which it is incorporated.

There is therefore a need for improved systems and methods for calibrating an oscillator.

SUMMARY

Embodiments of the present disclosure enable an oscillator to be calibrated in order to compensate the dispersions generated, on the one hand, during the process of fabricating the oscillator circuit components and, on the other hand, by variations of operating conditions by modifying the parameters of a resonant component, for example a capacitor or an induction coil of the oscillator, in order to change the frequency range covered by the oscillator, according to the control voltage.

In one embodiment, the present disclosure provides a method of calibrating an oscillator to adjust the output frequency of the oscillator according to an oscillator control signal. The method includes comparing the frequency of a reference signal to be obtained at the output of the oscillator and the frequency of the output signal of the oscillator divided by a quantity. The method also includes determining an impedance value to be connected to the oscillator from a set of impedances, each corresponding to a frequency deviation of the oscillator so as to modify the output frequency of the oscillator to make it match the reference frequency. The method further includes connecting the impedance to the oscillator.

In another embodiment, the present disclosure provides a device to calibrate an oscillator and adjust the output frequency of the oscillator according to an oscillator control signal. The device includes a measurement stage to determine the difference between the output frequency of the oscillator divided by a quantity and a reference frequency of the oscillator. The device also includes a set of impedances selectively connected to the oscillator and each corresponding to a frequency deviation of the oscillator. The device further includes a calibration stage to generate a calibration word according to the measured frequency difference, the calibration word having a set of bits, each intended to provoke the connection to the oscillator of one impedance from the set of impedances, so as to modify the output frequency of the oscillator to make it match the reference frequency.

In still another embodiment, the present disclosure provides an oscillator calibrator. The calibrator includes a measurement stage to determine the difference between the output frequency of an oscillator divided by a quantity and a reference frequency of the oscillator. The calibrator also includes a set of impedances selectively connected to the oscillator and each corresponding to a frequency deviation of the oscillator. The calibrator further includes a calibration stage to generate a calibration word according to the measured frequency difference, the calibration word having a set of bits, each intended to provoke the connection to the oscillator of one impedance from the set of impedances.

Other technical features may be readily apparent to one skilled in the art from the following figures, descriptions and claims.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

It should be understood that in the present disclosure, "oscillator" means any component, such as a voltage-controlled oscillator, or resonator, capable of supplying an oscillating signal.

Figure 1:
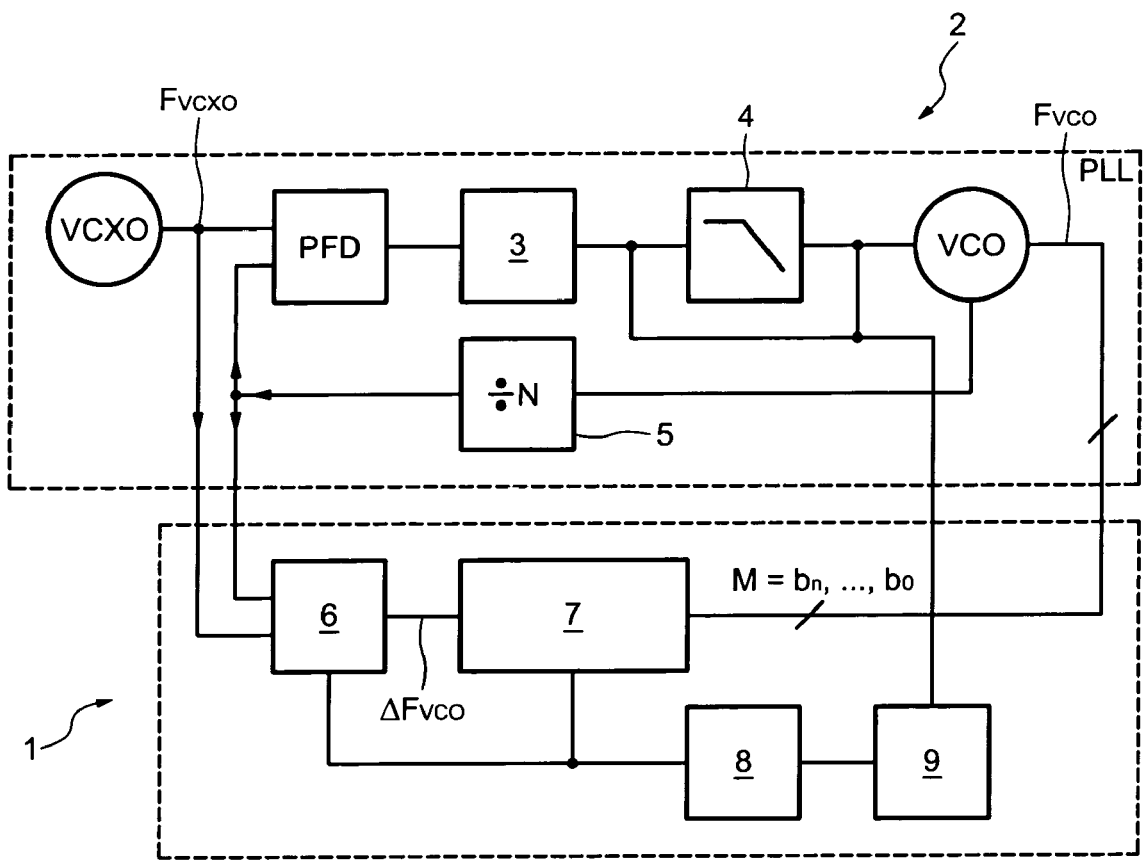
FIG. 1 is a block diagram illustrating the general architecture of a voltage-controlled oscillator associated with a phase-locked loop and a calibration device according to one embodiment of the present disclosure.

FIG. 1 represents the general architecture 100 of a calibration device 1 according to the present disclosure. Calibration device 1 is intended to provide calibration for a voltage-controlled oscillator 2. However, as indicated previously, the present disclosure applies to the calibration of any other oscillator or resonator, in particular any other oscillator or resonator with a resonant circuit based on the use of an induction coil or a capacitor.

As can be seen in FIG. 1, the oscillator 2 mainly comprises a voltage-controlled oscillator VCO incorporated in a phase-locked loop PLL which locks the output frequency $F_{VCO}$ of the VCO oscillator on a reference frequency $F_{VCXO}$ generated, for example, by a quartz crystal. The phase-locked loop mainly includes a phase and frequency comparator PFD for calculating the phase and frequency difference between the reference frequency $F_{VCXO}$ of the signal derived from the VCXO frequency standard and the output frequency $F_{VCO}$ of the voltage-controlled oscillator divided by a quantity "N".

The phase and frequency comparator PFD is connected to a converter 3 includes a charge pump providing current-mode conversion of the calculated phase and frequency difference and a fine adjustment of the frequency of the VCO oscillator. Converter 3 is connected to the input of a filter 4 mainly comprising a capacitor for integrating the current output from the converter 3 to generate a VCO oscillator control voltage V.

The circuit of the oscillator 2 illustrated in FIG. 1 is complemented by a divider 5 for dividing by the quantity "N" the output frequency $F_{VCO}$ of the oscillator. The output frequency $F_{VCO}$ and the reference frequency are thus linked by the division rank of the oscillator according to the relationship given in Equation 1 below.

$$F_{VCO} = N \cdot F_{VCXO} \tag{Eqn. 1}$$

As is known, the output frequency $F_{VCO}$ delivered by the oscillator is given by relationship in Equation 2 below.

$$F_{VCO} = \frac{1}{2\pi \times \sqrt{LC}} \tag{Eqn. 2}$$

In Equation 2, L and C, respectively denote the inductance and the capacitor of the oscillating circuit of the VCO oscillator. As indicated previously, the value of the inductance and the capacitor are likely to vary because of variations in their characteristics resulting from the method of fabricating these components, or because of variations in operating parameters. For example, regarding the inductance, these components are produced in the form of conductive tracks. The fabrication methods are not able to form conductive tracks of perfectly constant and identical width between two inductances, which generates differences of inductance value between two oscillators which are otherwise identical and a consequential oscillation frequency difference. Thus, it is necessary to apply a calibration of the oscillator in order to take up these frequency drifts.

To calibrate the oscillator 2, the calibration device 1 selectively connects an impedance to the VCO oscillator in order to vary the denominator of the above Equation 2 so as to make the output frequency $F_{VCO}$ divided by the division rank N of the oscillator match the reference frequency $F_{VCXO}$ or, at least bring the output frequency of the oscillator close to it so that the phase-locked loop PLL can lock it onto the reference frequency $F_{VCXO}$. Preferably, the calibration device 1 selectively connects in parallel a capacitor to the main capacitor of the oscillator. The capacitor is chosen from a set of predetermined capacitors each providing a frequency deviation for the oscillator 2. It is also possible to selectively connect in series an induction coil to the main induction coil of the oscillator.

As seen in FIG. 1, the calibration device 1 includes a measurement stage 6 for measuring the difference between the reference frequency $F_{VCXO}$ and the output frequency $F_{VCO}$ of the oscillator, after division by the divider 5. The calibration device 1 also comprises a calibration stage 7 proper which is used to choose the individual capacitors to be connected in parallel to the main capacitor of the VCO according to the measured frequency difference.

At the output, the calibration stage 7 supplies a control word M comprising a set of bits $b_0, \ldots b_n$, each controlling the switching of a switch connecting an individual capacitor in parallel to the main capacitor of the VCO oscillator (not shown).

As FIG. 1 shows, the calibration device 1 also includes a clock management block 8 which, on the one hand, paces all the component elements of the calibration device 1 and, on the other hand, manages the maximum calibration time, as will be described in detail below.

Finally, the calibration device 1 includes a pre-charging circuit 9 used mainly to generate a control voltage V. During the calibration, the precharging circuit 9 replaces the loop filter 4 to set a control voltage value V for the VCO oscillator such that only the calibration word can be used to vary the output frequency of the VCO oscillator.

It is also possible to apply a prior learning phase which consists in obtaining, for each rating, a curve showing the trend of the frequency $F_{VCO}$ according to the control voltage V. In other words, during this prior phase, each frequency $F_{VCO}$ has linked to it a rating-control voltage pairing. This prior learning phase can be carried out either for each type of circuit or for each circuit. It consists in measuring, for each rating, that is for each word M, the frequency generated for different control voltages V. It is implemented as an open loop. Moreover, the calibration words M are organized such that successive words respectively correspond to increasing or decreasing values of the capacitor of the oscillator. Thus, the calibration phase can also consist in measuring and storing the frequency differences between the ratings, considered in pairs.

From the frequency deviations obtained for each rating, the calibration phase then consists mainly in measuring the frequency differences between the output frequency $F_{VCO}$ of the oscillator divided by the division rank N and the reference frequency $F_{VCXO}$ in order to select the rating to be used to modify the overall value of the capacitor C of the oscillator.

Figure 2:
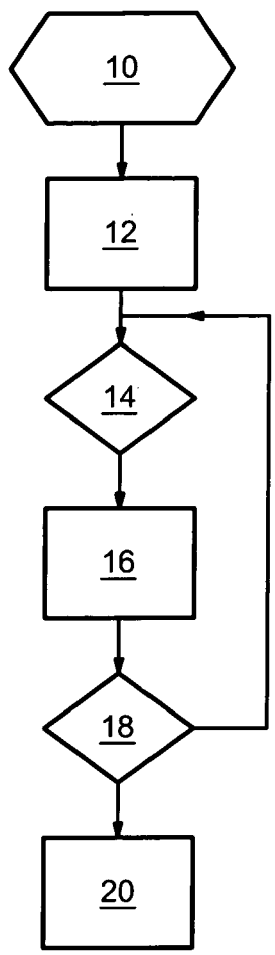
FIG. 2 is a flow diagram illustrating the main phases of the calibration method according to one embodiment of the present disclosure.

The calibration procedure 200 according to one embodiment of the present disclosure will now be detailed with reference to FIG. 2. This procedure begins first with a calibration request (step 10). Such a step can be applied on each use in order to adapt the behaviour of the oscillator to the particular conditions in which it is operating.

In the next step 12, the VCO oscillator is precharged by means of the precharging circuit 9. During this step 12, a value of a counter-downcounter is set to zero. Also, the rating is set to its maximum value. For example, all the bits of the control word M are set to "1", which forces the output frequency of the VCO oscillator to its lowest value. At the end of this prior initialization phase, the calibration proper takes place.

The difference between the output frequency $F_{VCO}$ divided by the division rank N of the oscillator and the reference frequency $F_{VCXO}$ is then measured. This difference is measured immediately a frequency difference is detected. To do this, by referring also to FIG. 1, the measurement stage 6 incorporates a counter-downcounter, the value of which has previously been set to zero (step 12).

Figure 3:
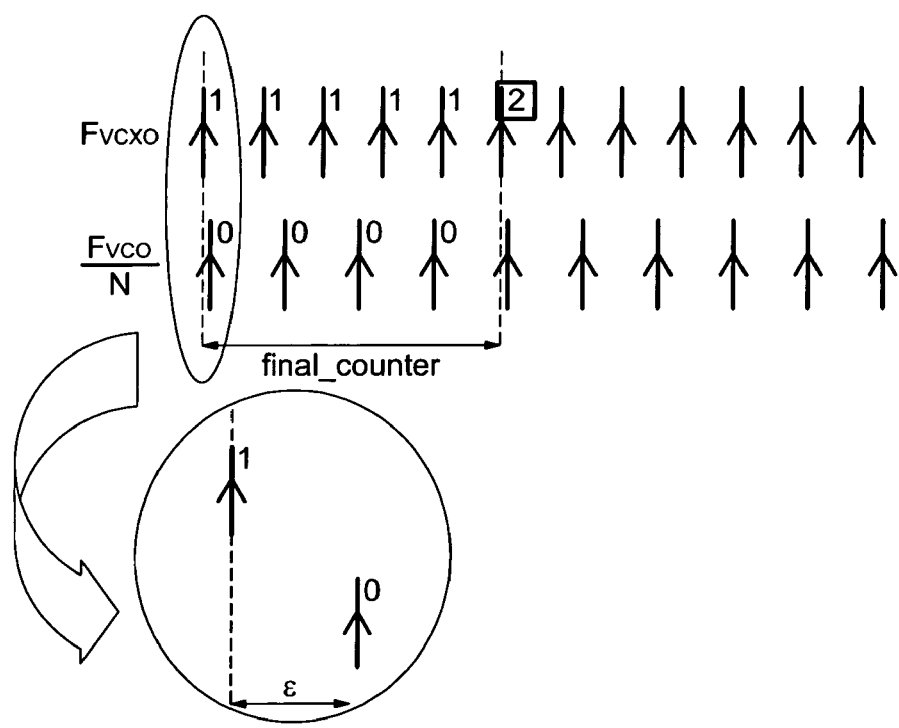
FIG. 3 is a diagram illustrating the general principle of calibration according to one embodiment of the present disclosure.

In one embodiment illustrated in FIG. 3, in which the digits associated with each edge indicate the count value of the counter-downcounter 300, this counter is incremented by "1" on each rising edge of the VCXO reference signal. It is decremented by "1" on each rising edge of the divided output signal $F_{VCO}$. Thus, if the frequencies are identical, the only count values of the counter-downcounter 300 will be "0" and "1".

If this counter goes to "2", this means that, for two successive rising edges of the VCXO, there has been no rising edge originating from the VCO, which then means that the VCO is slower than the VCXO. Otherwise, if the counter is equal to "−1", this means that, for two successive rising edges of the VCO, there has been no rising edge originating from the VCXO, which means that the VCO is faster than the VCXO.

It is then possible, according to the result of the counter-downcounter 300, to know the behaviour of the output frequency relative to the reference clock. It is also possible, as a variant, to carry out a double count, which is applied only to the reference clock. It is possible, for example, to increment the counter-downcounter 300 by "1" on each rising edge of the reference signal $F_{VCXO}$. The counter-downcounter 300 is also incremented by "1" on each falling edge detected on the signal $F_{VCXO}$.

Conversely, this counter-downcounter 300 is decremented by "2" on each rising edge of the output signal $F_{VCO}$. If the frequencies are identical, the only values taken by the counter-downcounter 300 will be "0", "−1" and "1". If this counter goes to "2", this means that, for two successive edges of the VCXO, there has been no rising edge originating from the VCO, which means that the VCO is slower than the VCXO. Otherwise, if the counter is equal to "−2", this means that, for two successive rising edges of the VCO, there has been no active edge originating from the VCO, which means that the VCO is faster than the VCXO. Thus, by referring in particular to FIG. 2, during a first phase 14 of the calibration, there follows a detection of a rising edge of the reference signal output from the VCXO oscillator. If such is the case, there follows an incrementing of the clock pulse counter (step 16).

In the next step 18, there follows a detection of a rising edge in the signal output from the VCO oscillator (step 18). During this step, the object is to detect the appearance of a rising edge in the output signal of the VCO before a consecutive edge in the reference signal $F_{VCXO}$. As indicated previously, this detection can be performed by monitoring the value of the counter-downcounter 300 incremented on each active edge of the reference signal and decremented on each rising edge of the output signal of the VCO oscillator. If such is the case, the method returns to the preceding step 14 to wait for the appearance of a consecutive rising edge in the reference signal $F_{VCXO}$. Otherwise, in the next step 20, the value of the current clock pulse counter is assigned to a final count value "Final-Counter". The rating is then given by Equation 3 below.

$$G = \frac{Counter\_Max \times \Delta Inter\text{-}rating\_Freq}{Final\_Counter \times \Delta F_{VCOmin}} \quad \text{(Eqn. 3)}$$

In Equation 3, the term ΔInter-rating_Freq. denotes the frequency deviation between two consecutive ratings. Counter_Max denotes a maximum clock pulse value from which it is considered that the output frequency of the oscillator matches the reference frequency. Final_Counter denotes the value of the clock pulse counter at the end of the abovementioned step 20, namely, the number of clock pulses making it possible to detect a calibration fault, that is, making it possible to obtain a value, for example equal to "2" for the counter-downcounter 300. $\Delta F_{VCOmin}$ is a minimum frequency difference value detectable during a time corresponding to the value of Counter_Max.

In practice, the frequency deviation to be obtained, that is, the difference between the frequency of the VCO oscillator before calibration and after calibration can be given by Equation 4 below.

$$\Delta F_{VCO} = \frac{N \times F_{VCXO}}{Final\_Counter}[1 - Fcount \times \varepsilon] \quad \text{(Eqn. 4)}$$

In Equation 4, N denotes the division rank of the divider 5 and ε is the frequency error on startup generated by the divider 5 and by the delay in the different gates involved in the make-up of the oscillator. Fcount denotes the frequency of the VCO oscillator rounded to the reference frequency.

With the relationship in Equation 3, it is possible to determine the number of clock pulses that make it possible to detect a calibration fault, that is, to obtain a value "2" for the counter-downcounter according to the division rank, the frequency error ε and the reference frequency $F_{VCXO}$. By neglecting the frequency error, the number of clock pulses making it possible to detect a mismatch between the frequency of the oscillator and the reference frequency is given by Equation 5 below.

$$Final\_Counter = N \times \frac{F_{VCXO}}{\Delta F_{VCO}} \quad \text{(Eqn. 5)}$$

As indicated previously, to determine the rating, there is first of all determined a maximum number Counter_Max of clock pulses beyond which it is considered that the output frequency matches the reference frequency, and a minimum frequency difference value $\Delta F_{VCOmin}$ corresponding to a minimum error that it is desirable to measure. The rating is then determined from the ratio between the maximum number of clock pulses Counter_Max and the number of clock pulses Final_Counter from which a frequency difference is detected and the ratio between the frequency deviation obtained between two ratings and the minimum frequency error $\Delta F_{VCOmin}$ (relation (2)).

Thus, according to one embodiment of the present disclosure, there is determined a rating skip to be performed from an initial rating according to which all the capacitors are switched to the main capacitor of the oscillator so as to obtain the lowest frequency, by determining the difference between the output frequency of the oscillator and the frequency to be obtained after calibration, that is, the frequency deviation to be obtained, and by using a learning table giving the rating skip to be performed to obtain the desired frequency deviation.

According to one embodiment of the present disclosure, there is calculated, by simulation, the frequency difference between each rating, for a given voltage, and there is then determined, from the initial rating, the rating skip to be performed to obtain the desired deviation. It will be noted, however, that according to this variant, it is desirable to carry out two successive calculations in order to obtain a relatively accurate result.

Accordingly, one embodiment of the present disclosure applies to the calibration of such an oscillator in order to adjust its output frequency according to a control signal applied to it.

It may be advantageous to set forth definitions of certain words and phrases used in this patent document. The term "couple" and its derivatives refer to any direct or indirect communication between two or more elements, whether or not those elements are in physical contact with one another. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A method of calibrating an oscillator to adjust the output frequency of the oscillator according to an oscillator control signal, the method comprising:
    comparing the frequency of a reference signal to be obtained at the output of the oscillator and the frequency of the output signal of the oscillator divided by a quantity;
    determining an impedance value to be connected to the oscillator from a set of impedances, each corresponding to a frequency deviation of the oscillator so as to modify the output frequency of the oscillator to make it match the reference frequency; and
    connecting the impedance to the oscillator,
    wherein determining the impedance value comprises:
        changing a counter-downcounter by a first number on each occurrence of at least one of a rising edge and a falling edge of the oscillator reference signal,
        changing the counter-downcounter by a second number on each occurrence of at least one of a rising edge and a falling edge of the output signal, the second number having a mathematical sign opposite of the first number, and
        determining the impedance value when the count value of the counter-downcounter exceeds a predetermined threshold value.

2. The method according to claim 1, wherein the oscillator is a voltage-controlled oscillator and the impedance to be connected to the oscillator comprises at least one capacitor that can be selectively connected in parallel to a main capacitor of the oscillator.

3. The method according to claim 1, wherein the impedance is an induction coil selectively connected in series to a main induction coil of the oscillator.

4. The method according to claim 1, wherein determining the impedance value further comprises:
    determining a calibration word comprising a set of calibration bits, each used to control the switching of a switch for connecting one of the impedances.

5. The method according to claim 1 further comprising setting an oscillator control voltage.

6. The method according to claim 4, further comprising:
    extracting the calibration word from a storage in which a set of calibration words generated by a prior learning process and each corresponding to a frequency value of the oscillator are stored.

7. The method according to claim 4, wherein determining the impedance value further comprises:
    skipping the calibration words to be performed from a predetermined calibration word to obtain a frequency deviation with which to make the output frequency of the oscillator match the reference frequency.

8. The method according to claim 7, wherein skipping the calibration words to be performed is determined on the basis of a calibration table generated by a prior learning process and giving a frequency deviation obtained by each impedance when it is connected to the oscillator.

9. The method according to claim 7, wherein skipping the calibration words to be performed is determined on the basis of an evaluation of a frequency deviation between two consecutive calibration words and the frequency deviation to be obtained.

10. The method according to claim 1, wherein the-counter-downcounter is incremented by the first number on each rising edge of the oscillator reference signal
    and the counter-downcounter is decremented by the first number on each rising edge of the output signal.

11. The method according to claim 1, wherein the counter-downcounter is incremented by "1" on each rising edge of the reference signal and the counter- downcounter is decremented by "1" on each rising edge of the output signal, and the impedance value is determined when the count value differs from the values "0" or "1".

12. The method according to claim 10, wherein the counter-downcounter is incremented by "1" on each rising edge and on each falling edge of the reference signal and the counter-downcounter is decremented by "2" on each rising edge of the output signal, and the impedance value is determined when the count value differs from the values "0", "−1" or "+1".

13. The method according to claim 10 further comprising:
    determining a maximum number of clock pulses of the oscillator beyond which it is considered that the output frequency matches the reference frequency and a minimum detectable frequency difference value during the number of clock pulses and correctable by connecting an individual impedance, and in that the ratio between the maximum number of clock pulses of the oscillator and the number of clock pulses from which a frequency difference is detected is calculated, and the impedances are connected according to the result of the ratio calculation and of the minimum correctable frequency difference value.

14. A device to calibrate an oscillator and adjust the output frequency of the oscillator according to an oscillator control signal, the device comprising:
    a measurement stage to determine the difference between the output frequency of the oscillator divided by a quantity and a reference frequency of the oscillator;
    a set of impedances selectively connected to the oscillator and each corresponding to a frequency deviation of the oscillator; and
    a calibration stage to generate a calibration word according to the determined frequency difference, the calibration word having a set of bits, each intended to provoke the connection to the oscillator of one impedance from the set of impedances, so as to modify the output frequency of the oscillator to make it match the reference frequency, wherein the measurement stage is configured to:
change a counter-downcounter by a first number on each occurrence of at least one of a rising edge and a falling edge of the oscillator control signal,
change the counter-downcounter by a second number on each occurrence of at least one of a rising edge and a falling edge of the output signal, the second number having an opposite mathematical sign of the first number, and
determine the impedance value when the count value of the counter-downcounter exceeds a predetermined threshold value.

15. The device according to claim 14, further comprising:
a precharging circuit to generate a set of oscillator control signals to determine, during a learning process, the frequency deviations obtained by each impedance, for each control signal.

16. The device according to claim 14 further comprising a clock management block to pace the calibration device.

17. The device according to claim 16, wherein the clock management block comprises a circuit to generate a maximum calibration time, and
wherein the calibration stage comprises a circuit to calculate the ratio between, on the one hand, a maximum number of clock pulses of the oscillator beyond which it is considered that the output frequency of the oscillator matches the reference frequency and, on the other hand, the number of clock pulses from which a frequency difference is detected, the impedances being selectively connected to the oscillator according to the calculated ratio and a minimum correctable frequency value.

18. The device according to claim 14, wherein the calibration stage comprises a calibration table generated by a prior learning process and giving a frequency value obtained by each impedance when it is connected to the oscillator.

19. An oscillator calibrator, the calibrator comprising:
a measurement stage to determine the difference between the output frequency of an oscillator divided by a quantity and a reference frequency of the oscillator;
a set of impedances selectively connected to the oscillator and each corresponding to a frequency deviation of the oscillator; and
a calibration stage to generate a calibration word according to the determined frequency difference, the calibration word having a set of bits, each intended to provoke the connection to the oscillator of one impedance from the set of impedances,
wherein the measurement stage is configured to:
change a counter-downcounter by a first number on each occurrence of at least one of a rising edge and a falling edge of the oscillator control signal,
change the counter-downcounter by a second number on each occurrence of at least one of a rising edge and a falling edge of the output signal, the second number having an opposite mathematical sign of the first number, and
determine the impedance value when the count value of the counter-downcounter exceeds a predetermined threshold value.

20. The calibrator according to claim 19, wherein the calibration stage modifies the output frequency of the oscillator to make it match the reference frequency.

* * * * *